United States Patent
Akutagawa et al.

(10) Patent No.: US 7,888,258 B2
(45) Date of Patent: Feb. 15, 2011

(54) FORMING METHOD OF ELECTRODE AND MANUFACTURING METHOD OF SEMICONDUCTOR DEVICE

(75) Inventors: Yoshito Akutagawa, Kawasaki (JP); Hiroyuki Matsui, Kawasaki (JP); Yutaka Makino, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 22 days.

(21) Appl. No.: 12/143,921

(22) Filed: Jun. 23, 2008

(65) Prior Publication Data

US 2009/0087984 A1    Apr. 2, 2009

(30) Foreign Application Priority Data

Sep. 27, 2007    (JP)    ............... 2007-251411

(51) Int. Cl.
    *H01L 21/44* (2006.01)
(52) U.S. Cl. .................. 438/612; 257/E21.59
(58) Field of Classification Search ........ 438/632, 438/646, 658, 612, 652, 618
    See application file for complete search history.

(56) References Cited

U.S. PATENT DOCUMENTS

| 5,046,658 | A  | * | 9/1991  | Morris         | 228/206 |
| 6,528,345 | B1 | * | 3/2003  | Cook et al.    | 438/108 |
| 6,666,369 | B2 | * | 12/2003 | Matsuki et al. | 228/199 |
| 6,732,911 | B2 |   | 5/2004  | Matsuki        |         |
| 7,059,512 | B2 | * | 6/2006  | Arita et al.   | 228/254 |
| 2002/0076909 | A1 | * | 6/2002 | Matsuki et al. | 438/612 |
| 2004/0072387 | A1 | * | 4/2004 | Hong et al.    | 438/108 |
| 2006/0035454 | A1 | * | 2/2006 | Belanger et al.| 438/616 |
| 2009/0309219 | A1 | * | 12/2009 | Gruber et al. | 257/738 |

FOREIGN PATENT DOCUMENTS

| JP | 6-226437 A     |   | 8/1994  |
| JP | 2001-156091    | * | 6/2001  |
| JP | 56069853       | * | 6/2001  |
| JP | 2001-244283 A  |   | 9/2001  |
| JP | 2006159266     | * | 6/2006  |
| KR | 0285783        |   | 5/2001  |
| KR | 0540868        |   | 1/2006  |

OTHER PUBLICATIONS

KIPO; Office Action mailed by the Korean Intellectual Property Office in connection with KR 10-2008-0094526, a foreign correspondent application; English translation of the office action is provided.

\* cited by examiner

*Primary Examiner*—Savitri Mulpuri
(74) *Attorney, Agent, or Firm*—Fujitsu Patent Center (57) ABSTRACT

A forming method of an electrode includes the steps of providing an electrode material on a conductive part; exposing the electrode material at a temperature equal to or higher than a melting point of the electrode material in an oxidizing atmosphere; and exposing the melted electrode material, in a reducing atmosphere, at a temperature equal to or higher than the melting point of the electrode material and lower than the temperature at which the electrode material is exposed in the oxidizing atmosphere.

8 Claims, 9 Drawing Sheets

FORMING METHOD OF ELECTRODE AND MANUFACTURING METHOD OF SEMICONDUCTOR DEVICE

BACKGROUND

1. Field of the Invention

The present invention generally relates to forming methods of electrodes and manufacturing methods of semiconductor devices. More specifically, the present invention relates to a forming method of an electrode having a reflow process using a reducing atmosphere and a manufacturing method of a semiconductor device having the electrode.

2. Description of the Related Art

A projection electrode made of spherical-shaped solder has been applied as an outside connection electrode of a semiconductor element such as a semiconductor integrated circuit element or an outside connection terminal of a wiring board where the semiconductor element is mounted.

Such a projection electrode is called a bump. In a case where the projection electrode is made of solder, lead (Pb)—tin (Sn) group solder or so-called lead free solder such as zinc (Sn)—silver (Ag) instead of lead group solder has been used. The solder is metal having a low melting point. An electrolytic plating method, an electroless plating method, a paste transferring method or a printing method is used as a method for forming the solder on the semiconductor element.

Since the solder formed by the above-mentioned method has a plane plate-shaped configuration, a columnar-shaped configuration or a mushroom-shaped configuration, a reflow process is applied after the solder is formed so that a solder bump having a substantially spherical-shaped external configuration is formed.

A method for connecting the semiconductor element on an electrode terminal on the wiring board using a solder bump (conventional solder or lead free solder) formed on a main surface of the semiconductor element is called a flip chip method or a face-down method because a main surface (electric circuit forming surface) of the semiconductor element faces a surface of the wiring board. In a case where the semiconductor element is mounted on the wiring board by such a flip chip method (face-down method), the solder bump is melted (reflows) and an oxide film on a surface of a terminal of the wiring board is removed by using flux so that the surface of the terminal is cleaned.

In a step of connecting solder using the flux, it is necessary to remove solidified flux with an organic solvent after the solder bump is connected.

However, the solidified flux cannot be sufficiently dissolved by a small amount of the organic solvent and a product material generated by dissolution cannot be completely removed. Because of this, the amount of the organic solvent used may be increasing. Use of a large amount of such an organic solvent may have an adverse impact on environment.

On the other hand, as the semiconductor elements have higher integration and are made minute, there is tendency that a size (height) of the solder bump is made small (short). Hence, a gap between the semiconductor element and the circuit board is narrower.

In addition, since high functionality and multiple functions are required for the semiconductor elements, there is tendency that the external dimensions of the semiconductor elements become larger so that an area facing the wiring board increases. Accordingly, it becomes difficult to implement a cleaning process using the organic solvent.

Because of this, recently, a reflow processing method has been suggested where hydrogen ($H_2$) and formic (methanoic) acid (HCOOH) are used as a reducer and the cleaning process is not required.

For example, a method for implementing a reflow process in a chamber having a reducing gas environment made of mainly hydrogen ($H_2$) has been suggested as a method for reflowing cream solder in a reducing gas environment. See Japanese Patent Application Laid-Open Publication No. 6-226437.

In addition, the following method has been suggested as a manufacturing method of a semiconductor device having a solder reflow step using formic (methanoic) acid (HCOOH) as a reducer. That is, first, a solder layer is formed on a metal film of the semiconductor device. The semiconductor device and the solder layer are arranged in a depressed environment including the formic acid. The solder layer is heated and melted in the environment. After that, the environment is discharged and the solder layer is held at a temperature lower than the melting point of the solder and equal to or higher than the boiling point of formic (methanoic) acid (HCOOH) for a designated time. See Japanese Patent Application Laid-Open Publication No. 2001-244283.

SUMMARY

According to an aspect of an embodiment, a forming method of an electrode includes the steps of: providing an electrode material on a conductive part; exposing the electrode material at a temperature equal to or higher than a melting point of the electrode material in an oxidizing atmosphere; and exposing the melted electrode material, in a reducing atmosphere, at a temperature equal to or higher than the melting point of the electrode material and lower than the temperature at which the electrode material is exposed in the oxidizing atmosphere.

According to an another aspect of an embodiment, a manufacturing method of a semiconductor device includes the steps of: providing an electrode material on a conductive part provided on a semiconductor substrate; exposing the electrode material at a temperature equal to or higher than a melting point of the electrode material in an oxidizing atmosphere; and exposing the melted electrode material, in a reducing atmosphere, at a temperature equal to or higher than the melting point of the electrode material and lower than the temperature at which the electrode material is exposed in the oxidizing atmosphere.

DETAILED DESCRIPTION OF EMBODIMENTS

A description is given below, with reference to FIG. 1 through FIG. 8 of embodiments of the present method.

When the solder bump is formed by using the above-mentioned electrolytic plating method, the electroless plating method, the paste transferring method or the printing method, a foreign body may remain inside the formed solder. The foreign body may cause generation of a void (bubble) in the solder in the melting (reflow) process. Furthermore, in the reflow process, when the temperature becomes high, the void explodes so that minute solder particles scatters.

In a solder connection step using the flux, since a reflow process is applied so that the solder bump is arranged in the flux, even if the void generated in the solder bump explodes and the minute solder particles are generated, the minute solder particles remain in the flux and are removed with the flux at the time of cleaning out the flux.

However, in a case of the reflow processing method using hydrogen ($H_2$) or formic (methanoic) acid (HCOOH) as a reducer, the minute solder particles scattering at the time when the void explodes may be provided and remain on a surface of the semiconductor element and/or a circuit board.

Such a phenomenon is discussed with reference to FIG. 1.

Figure 1:
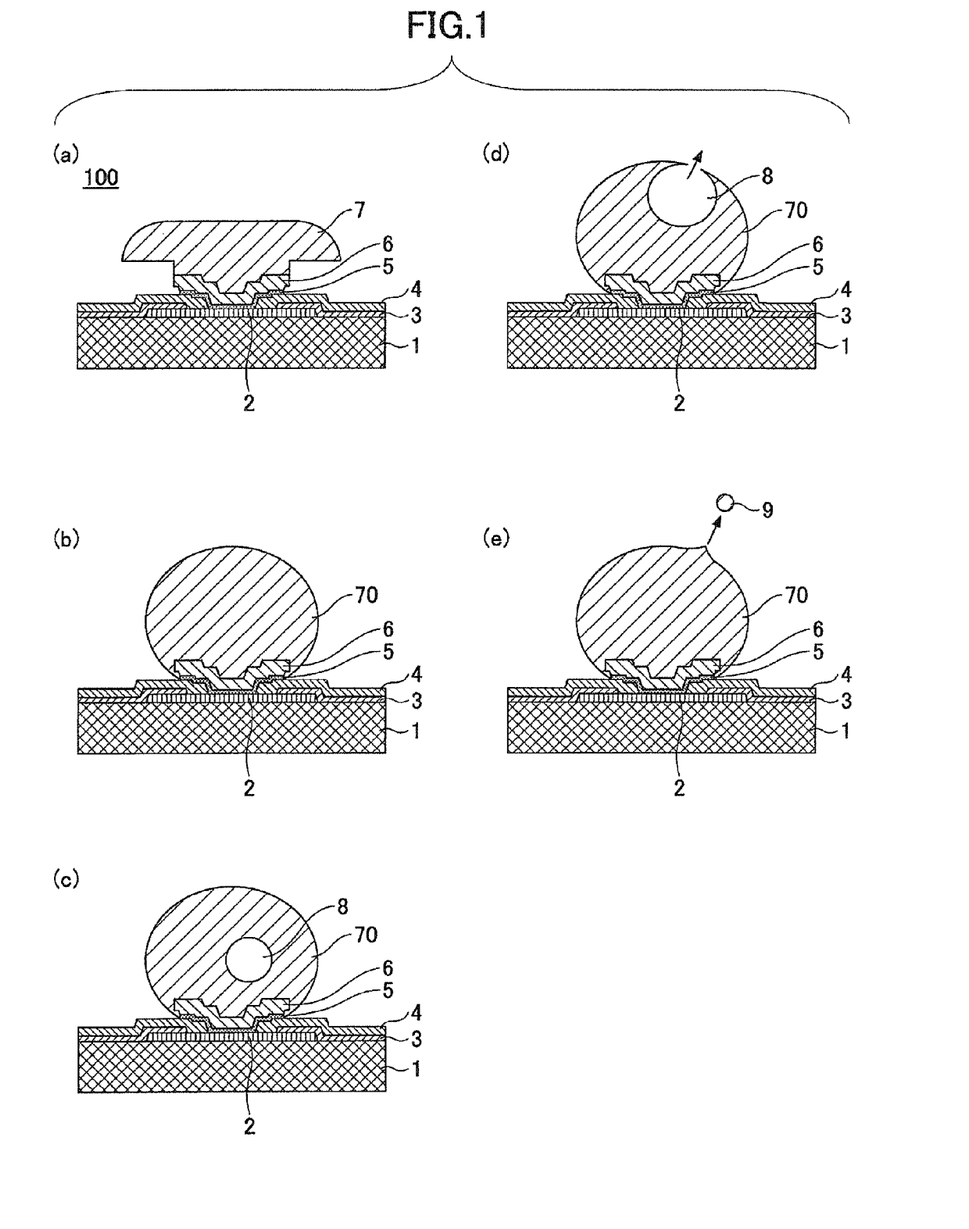
FIG. 1 is a cross-sectional view showing a first reflow process.

FIG. 1 shows a step for providing solder on an electrode pad of a semiconductor element, applying a reflow process to the solder and forming a solder bump having a substantially spherical shape. It is general practice that plural electrode pads are provided on a main surface of the semiconductor element and a solder bump is provided on each electrode pad. However, FIG. 1 shows a single electrode pad and a step for providing a solder bump on the electrode pad. In a semiconductor element 100 where a solder bump having a substantially spherical shape is formed, a wiring layer (not shown in FIG. 1) made of aluminum (Al) and an electrode pad (electrode layer) 2 are provided on a main surface (circuit element forming surface) of a semiconductor substrate 1 made of, for example, silicon (Si) via an insulation film (layer) such as silicon oxide. If necessary, a so-called multi-layer interconnection structure is applied to the semiconductor element 100.

A solder layer 7 is provided on the electrode pad 2. The solder layer 7 expands in a mushroom shaped manner via UBM (Under-Bump Metallization) layers 5 and 6. See FIG. 1(a).

In this structure, an inorganic insulation layer 3 made of an inorganic insulation material such as silicon oxide ($SiO_2$) or silicon nitride (SiN) is provided on the semiconductor substrate 1 including the wiring layer and on the electrode pad 2. Furthermore, an opening is formed in the inorganic insulation layer 3 on the electrode pad 2. In addition, an organic insulation layer 4 is provided on the inorganic insulation layer 3 and covers an end surface of the opening part of the inorganic insulation layer 3 on the electrode pad 2.

The organic insulation layer 4 is made of an organic insulation material such as polyimide, benzo cyclo butene (BCB), phenol resin, or poly benzo oxadiazole (PBO).

A first UBM layer 5 made of titanium (Ti) or chromium (Cr) is provided in an area on the electrode pad not covered with the insulation layers 3 and 4. In addition, a second UBM layer 6 is stacked on the first UBM layer 5. The second UBM layer is made of nickel (Ni) or copper (Cu).

A stacking layer structural body of the metal layers 5 and 6 extends to an upper surface of the organic insulation layer 4. A solder layer 7 having a mushroom-shaped configuration is provided on the metal layer 6. The solder layer 7 is made of lead (Pb)—tin (Sn) group solder or so-called lead free solder such as zinc (Sn)—silver (Ag). The solder layer 7 is formed on the metal layer 6 by using a so-called selective plating method. An oxide film (natural oxide film, not shown in FIG. 1) is formed on the surface of the solder layer 7.

The semiconductor substrate 1 having the above-discussed structure is, first, exposed in a reducing gas environment such as formic (methanoic) acid (HCOOH) gas (initial reducing step).

The semiconductor element 100 where the solder layer 7 is provided is heated at a temperature equal to or higher than the melting point of the solder in the reducing gas environment. As a result of this, the solder layer 7 is melted so that a solder bump 70 having a spherical external shape due to its surface tension is formed. See FIG. 1(b).

At this time, the natural oxide film formed on the surface of the solder layer 7 is reduced and removed. During a forming process of the solder bump 70 in such a reducing gas environment, an addition agent in a plating liquid taken in the forming process of the solder bump 70 evaporates so that a void (bubble) is generated in the solder bump 70. See FIG. 1(c).

The void 8 generated in the solder bump 70 moves in the molten solder bump 70 due to a heating process for a designate time so as to appear in an upper surface part of the solder bump 70. See FIG. 1(d).

At this time, the oxide film does not exist on the surface of the solder bump 70. Because of this, the void 8 explodes so that the addition agent of the evaporated plating liquid existing in the void 8 scatters. In a case where the temperature of the semiconductor substrate 1 is higher than the melting point of the solder bump 70, the addition agent of the evaporated plating liquid in the void 8 scatters and jets more furiously so that minute solder particles 9 scatter. See FIG. 1(e).

As a result of this, the minute solder particles 9 are provided and remain on the surface of the semiconductor substrate 1 in the periphery of the solder bump 70. After the spherical shaped solder bump 70 is formed, heating the semiconductor substrate 1 is stopped. As a result of this, the temperature of the semiconductor substrate 1 gradually decreases. When the temperature of the semiconductor substrate 1 becomes equal to or lower than the melting point of the solder bump 70, the solder bump 70 is solidified.

The minute solder particles 9 may possibly form a part of a conductive path. Hence, when a semiconductor element 100 cut and divided from the semiconductor substrate 1 is mounted on a circuit board, shorts between wiring layers of the circuit board and the semiconductor element 100 may be caused so that reliability may be degraded.

In order to prevent the minute solder particles 9 from scattering due to explosion of the void 8 formed in the solder bump 70, a reflow method that maintains the oxide film on the surface of the solder bump 70 has been suggested.

Figure 2:
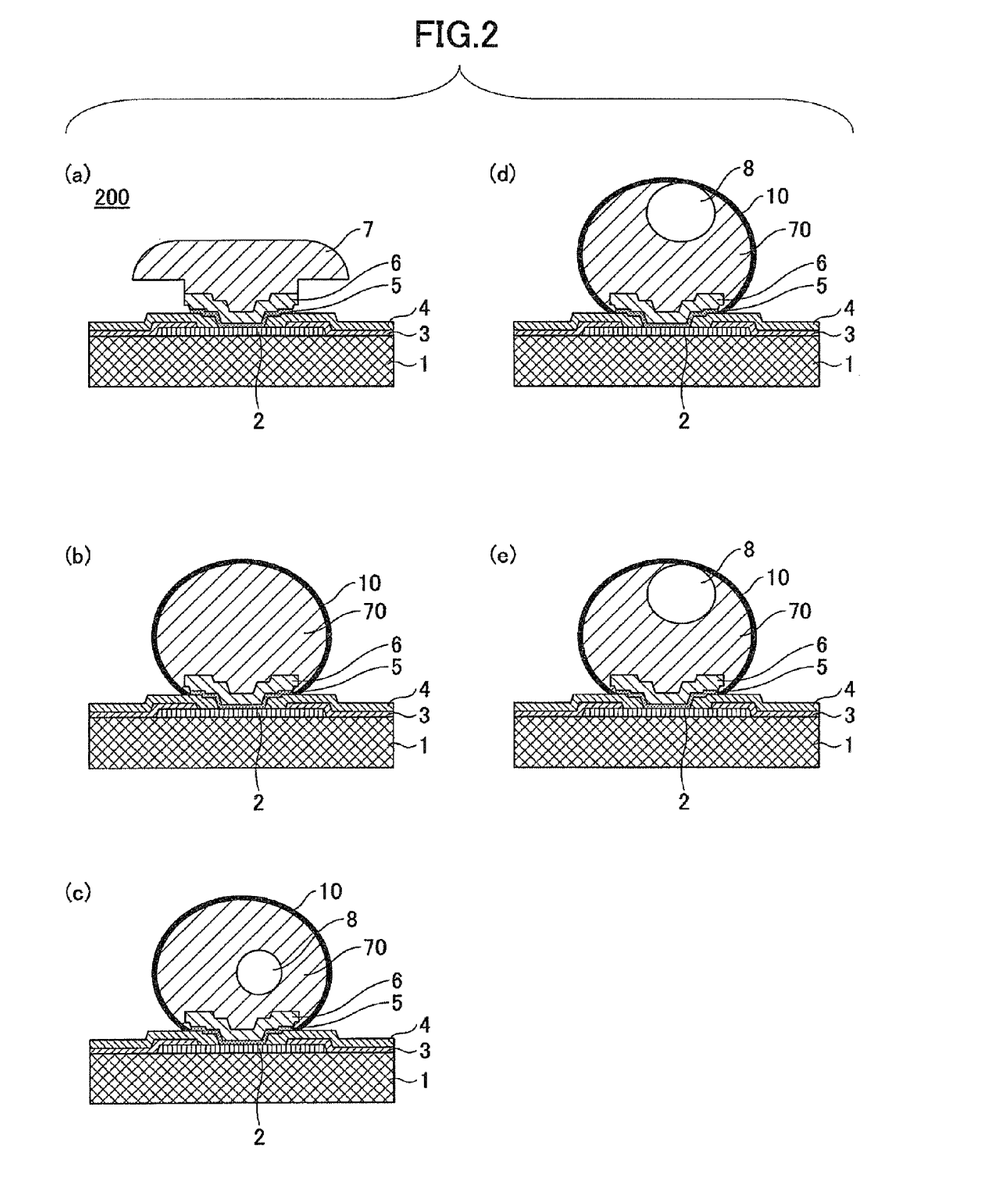
FIG. 2 is a cross-sectional view showing a second reflow process.

Such a reflow method is discussed with reference to FIG. 2. In the example shown in FIG. 2, solder 7 is formed on the electrode pad 2 of the semiconductor element 200, a reflow process is applied to the solder 7 and a solder bump 70 having a substantially spherical shape is formed. In other words, FIG. 2 shows a step of providing the solder bump 70 on a single electrode pad 2. In FIG. 2, parts that are the same as the parts shown in FIG. 1 are given the same reference numerals, and explanation thereof is omitted.

That is, in the semiconductor element 200 where a solder bump 70 having a substantially spherical shape is formed, a wiring layer (not shown in FIG. 2) made of aluminum (Al) and an electrode pad (electrode layer) 2 are provided on a main surface (circuit element forming surface) of a semiconductor substrate 1 made of, for example, silicon (Si) via an insulation film (layer) such as silicon oxide. If necessary, a so-called multi-layer interconnection structure is applied to the semiconductor element 200.

A solder layer 7 is provided on the electrode pad 2. The solder layer 7 expands in a mushroom shaped manner via UBM layers 5 and 6. See FIG. 2(a).

The solder layer 7 is made of lead (Pb)—tin (Sn) group solder or so-called lead free solder such as zinc (Sn)—silver (Ag). The solder layer 7 is formed on the metal layer 6 by using a so-called selective plating method. An oxide film (natural oxide film, not shown in FIG. 2) is formed on the surface of the solder layer 7. The semiconductor substrate 1 having the above-discussed structure is, first, exposed in a reducing gas environment such as formic (methanoic) acid (HCOOH) gas (initial reducing step).

The oxide film formed on the surface of the solder layer 7 is reduced and removed by the reducing process. After the reducing process, the semiconductor substrate 1 is removed from the reducing gas environment. In other words, the supplying of the reducing gas stops so that the semiconductor substrate 1 comes in contact with oxidizing atmosphere. The semiconductor substrate 1 remains exposed in the oxidizing atmosphere after this step.

Next, the semiconductor substrate 1 is heated at a temperature equal to or higher than the melting point of the solder. As a result of this, the solder layer 7 is melted so that a solder bump 70 having a spherical shaped external configuration due to its surface tension is formed. See FIG. 2(b).

At this time, the oxide film 10 is formed on the surface of the solder bump 70 due to moisture generated by thermal decomposition of elements forming reducing gas or residual oxygen.

During a forming process of the solder bump 70 in such an oxidizing environment, an addition agent in a plating liquid taken in during the forming process of the solder layer 7 evaporates so that a void (bubble) 8 is generated in the solder bump 70. See FIG. 2(c).

The void 8 generated in the solder bump 70 moves in the molten solder bump 70 due to a heating process for a designate time so as to appear in an upper surface part of the solder bump 70. See FIG. 2(d).

At this time, the oxide film 10 remains on the surface of the solder bump 70. Accordingly, the void 8 reaching the surface of the solder bump 70 is prevented from moving by the oxide film 10 so that the void 8 does not jet outside the bump 70. As a result of this, an explosion of the void 8, jetting of the addition agent of the gasified plating liquid due to explosion of the void 8, and scattering of the minute solder particles 9 are prevented. After the spherical shaped solder bump 70 is formed, heating the semiconductor substrate 1 stops.

As a result of this, the temperature of the semiconductor substrate 1 gradually decreases. When the temperature of the semiconductor substrate 1 becomes equal to or lower than the melting point of the solder bump 70, the solder bump 70 is solidified.

As a result of this, the void 8 remains in the solder bump 70. Because of this, the residual void 8 explodes with melting of the solder bump 70 when the semiconductor device is connected to an electrode of the circuit board via the solder bump 70. As a result of this, jetting of the addition agent of gasified plating liquid to the outside and scattering of the solder particles are generated so that reliability of connection may be degraded.

A reflow process to manufacture a solder bump as a projection made of metal having a low melting point which is an outside connection electrode terminal of a semiconductor element is discussed as an embodiment. As solder forming the solder bump, for example, lead (Pb)—tin (Sn) group solder or so-called lead free solder such as zinc (Sn)—silver (Ag) can be selected. In the following explanation, these bumps are called solder bumps.

Figure 3:
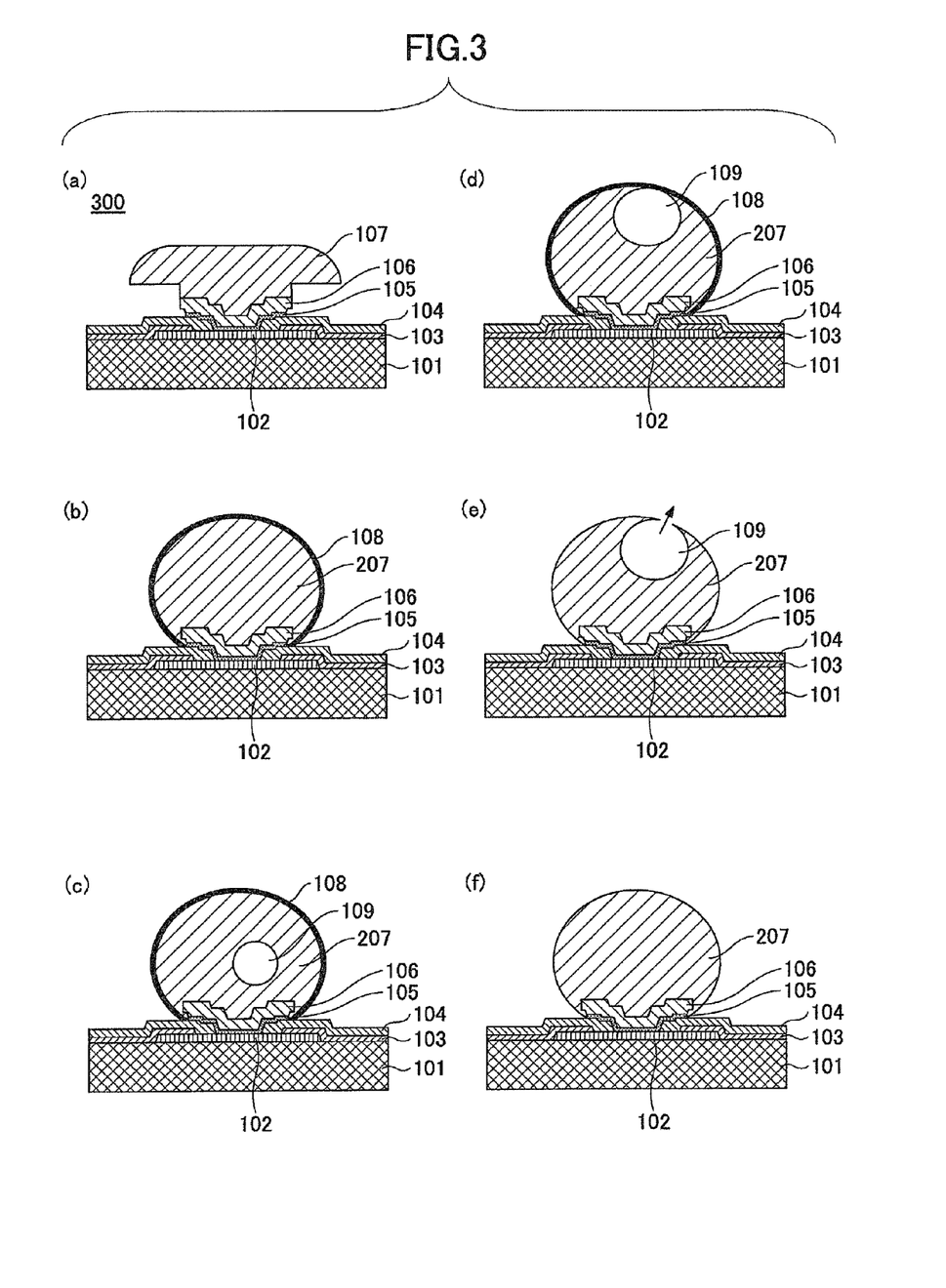
FIG. 3 is a cross-sectional view showing a forming method of an electrode of an embodiment.

FIG. 3 shows a step of forming solder on an electrode pad of the semiconductor element and applying a reflow process to the solder so that the outside connection electrode terminal made of a solder bump having a substantially spherical shaped configuration is formed. In the semiconductor element, normally, plural electrode pads are provided on a main surface of the semiconductor element and a solder bump is provided on each electrode pad. In addition, the reflow process is normally applied to a semiconductor substrate where plural semiconductor elements are formed.

In this example, an electrode pad of a single semiconductor element is shown and a step of providing the solder bump on the electrode pad by applying the reflow process is discussed.

In a semiconductor element 300 where a solder bump having a substantially spherical-shaped configuration is formed, a wiring layer (not shown in FIG. 3) made of aluminum (Al), copper (Cu), or the like and an electrode pad (electrode layer) 102 are provided on a main surface (semiconductor element forming surface) of a semiconductor substrate 101 made of, for example, silicon (Si) via an insulation film (layer) such as silicon oxide. If necessary, a so-called multi-layer interconnection structure is applied to the semiconductor element 300.

A solder layer 107 is provided on the electrode pad 102. The solder layer 107 expands in a mushroom shaped manner via UBM layers 105 and 106. See FIG. 3(a). The solder layer 107 is made of lead (Pb)—tin (Sn) group solder having a melting point of 314° C. consisting of 95% lead (Pb) and 5% zinc (Sn).

In this structure, an inorganic insulation layer 103 made of an inorganic insulation material such as silicon oxide ($SiO_2$) or silicon nitride (SiN) is provided on the semiconductor substrate 101 including the wiring layer and on the electrode pad 102.

Furthermore, an opening is selectively formed in the inorganic insulation layer 103 on the electrode pad 102. In addition, an organic insulation layer 104 is provided on the inorganic insulation layer 103 and covers an end surface of the opening part of the inorganic insulation layer 103 on the electrode pad 102. The organic insulation layer 104 is made of an organic insulation material such as polyimide, benzo cyclo butene (BCB), phenol resin, or poly benzo oxadiazole (PBO).

A first UBM (Under-Bump Metallization) layer 105 made of titanium (Ti) or chromium (Cr) is provided in an area on the electrode pad 102 not covered with the insulation layers 103 and 104. In addition, a second UBM layer 106 is stacked on the first UBM layer 105. The second UBM layer 106 is made of nickel (Ni) or copper (Cu).

A stacking layer structural body of the first UBM layer 105 and the second UBM layer 106 extends to an upper surface of the organic insulation layer 104. A solder layer 107 having a mushroom-shaped configuration is provided on the metal layer 106. The solder layer 107 is made of, for example, lead (Pb)—tin (Sn) and is formed on the metal layer 106 by using a so-called selective plating method. An oxide film (natural oxide film, not shown in FIG. 1) is formed on the surface of the solder layer 107.

An electrode structure of such a semiconductor element is formed by, for example, the following method.

In other words, after the inorganic insulation layer 103 and the organic insulation layer 104 are selectively provided so that an opening is formed on the electrode pad 102, an inside of the opening part, namely an exposed surface of the electrode pad 102 and an upper part of the organic insulation layer 104 are covered with titanium (Ti) or chromium (Cr) by a sputtering method so that the first UBM layer 105 is formed.

Next, a photo-resist layer is formed on the first UBM layer 105. A selective exposing process, a developing process, and a curing process are applied to the photo-resist layer so that an opening part corresponding to the insulation layer opening part on the electrode pad 102 is formed.

Next, an electro-plating process where the first UBM layer 105 is used as an electrode is applied so that the second UBM layer 106 made of nickel (Ni) or copper (Cu) is formed in the opening part of the photo-resist layer.

In addition, solder is formed on the second UBM layer 106 by an electro-plating method. The solder extends to the upper surface of the photo-resist layer.

After that, the photo-resist layer is removed and an unnecessary part of the second UBM layer 106 is removed by so-called a wet etching method using the solder layer 107 as an etching mask.

In addition, the second UBM layer 106 whose unnecessary part is removed is used as a mask so that an unnecessary part of the first UBM layer 105 is removed.

By using the method discussed above, the mushroom shaped solder layer 107 is provided on the electrode pad of the semiconductor element 300 via a stacked structural body of the first UBM layer 105 and the second UBM layer 106.

In the embodiment, a solder melting (reflow) process is applied to the semiconductor element 300 where the mushroom shaped solder layer 107 is provided on the electrode pad 102 as discussed above. The solder reflow process is applied to a semiconductor substrate where plural semiconductor elements 300 are formed.

Illustrations of an active element such as a transistor forming an electric circuit, a passive device such as a capacitive element, a wiring layer connecting to these functional elements, an interlayer insulator, and others, in a semiconductor element formed on a main surface (semiconductor element forming surface) of the semiconductor substrate 101, are omitted in the example shown in FIG. 3.

A reflow processing apparatus configured to apply the solder melting (reflow) process of an embodiment is discussed. The reflow process of the embodiment is implemented by the reflow processing apparatus having a structure, for example, shown in FIG. 5A.

Figure 5A:
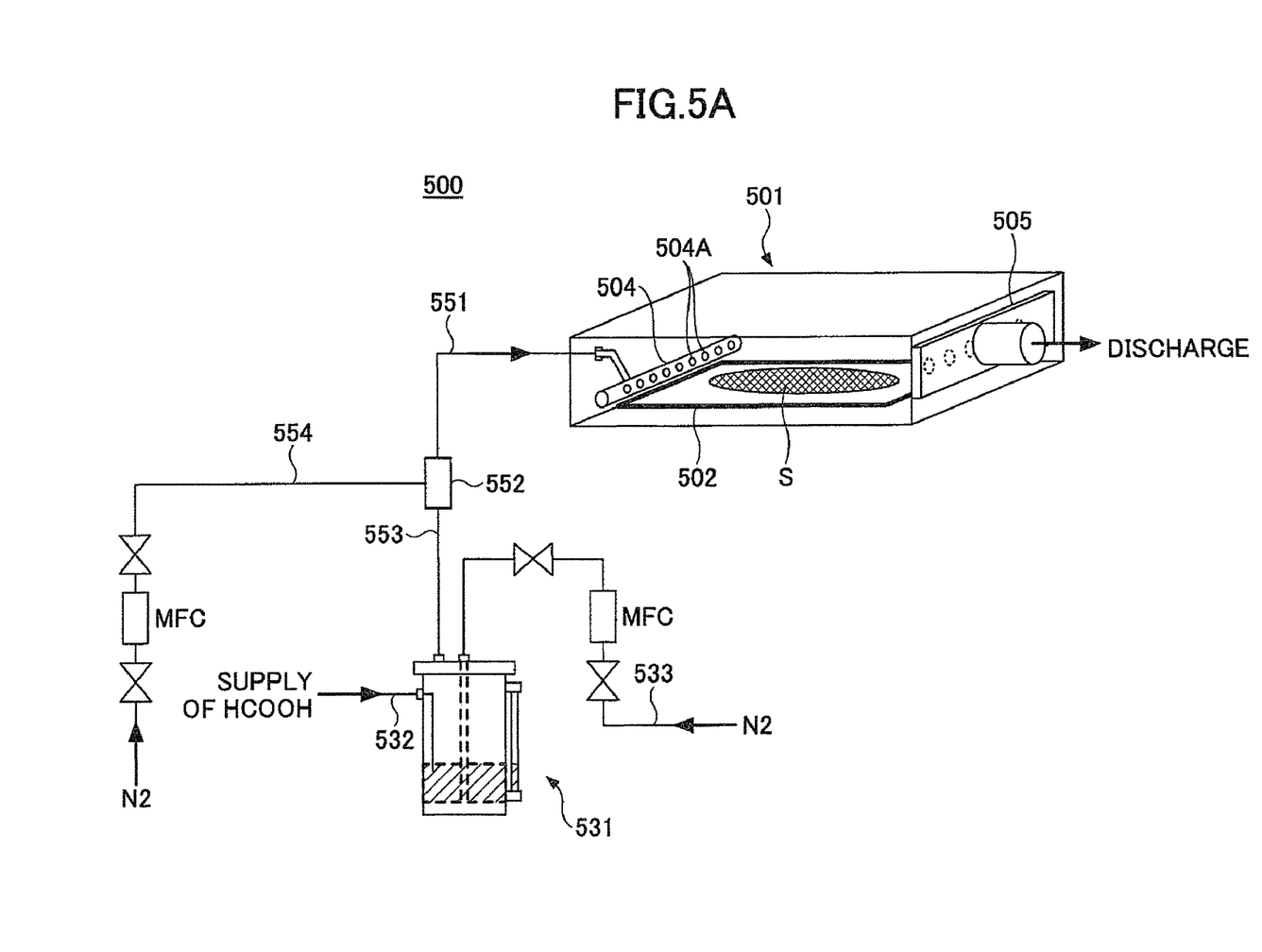
FIG. 5A is a schematic structural view of a reflow processing apparatus applied to the forming method of the electrode of the embodiment.
Figure 5B:
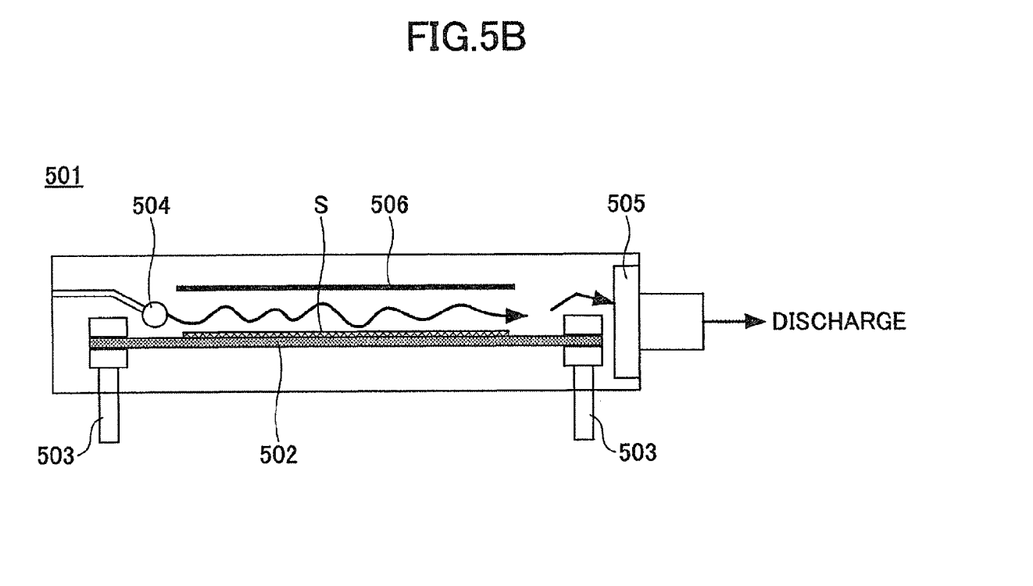
FIG. 5B is a cut-open side view of a processing chamber of the reflow processing apparatus shown in FIG. 5A.

For example, formic (methanoic) acid (HCOOH), as a reducer, is used in the reflow processing apparatus 500. The reflow processing apparatus 500 includes a process chamber 501 and a bubbling tank 531 of formic (methanoic) acid (HCOOH). The process chamber 501 is sealed and has a substantially box-shaped configuration. FIG. 5B schematically shows a cut-open side view of the processing chamber 501.

A heater 502 is provided on the bottom part of the processing chamber 501 so as to heat a subject semiconductor substrate S. Electrodes 503 of the heater 502 are introduced from the bottom surface of the process chamber 501 to the outside. A carbon heater may be applied as the heater 502. A gas supply and discharge part 504 is provided in the vicinity of the side surface inside the process chamber 501.

In the gas supply and discharge part 504, plural openings, namely plural gas supplying and discharging holes 504A, are provided in a long tube part provided along the internal surface of the process chamber 501. The gas supply and discharge part 504 is connected to the bubbling tank 531 of formic (methanoic) acid (HCOOH). The bubbling tank 531 is provided outside the process chamber 501.

Gas discharge holes 505 are formed in a side surface facing the gas supply and discharge part 504 inside the process chamber 501. The gas discharge holes 505 are connected to a gas processing apparatus (not shown in FIG. 5) via a discharge pump (not shown in FIG. 5).

In the processing chamber 501, a gas current plate 506 is provided above the subject semiconductor substrate S so as to be substantially parallel with a main surface of the subject semiconductor substrate S. It should be noted that it is not necessary to always provide the gas current plate 506.

On the other hand, formic (methanoic) acid (HCOOH) as a reducer or nitrogen ($N_2$) gas as an inactive gas is supplied to the gas supply or discharge part 504 of the process chamber 501 via a gas supply tube 551.

In other words, the gas supply or discharge part 504 is connected to a switching part 552 via the gas supply tube 551. The switching part 552 is connected to the bubbling tank 531 via the gas supply tube 553 and a nitrogen ($N_2$) gas source (not shown in FIG. 5A) via the gas supply tube 554.

Formic (methanoic) acid (HCOOH) is supplied to the bubbling tank 531 via the supply tube 532, and nitrogen ($N_2$) gas is supplied into a bath of formic (methanoic) acid (HCOOH) via a nitrogen gas supply tube 533 to implement a bubbling process of the formic (methanoic) acid (HCOOH). A mass flow controller MFC is provided at the nitrogen gas supply tube 533 so that the flow amount of nitrogen ($N_2$) gas is controlled so as to be kept constant regardless of changes of temperature and pressure.

In other words, in the reflow processing apparatus 500, formic (methanoic) acid (HCOOH) and nitrogen ($N_2$) gas are supplied to and contact the subject semiconductor substrate S received in the process chamber 501.

Changes of the configuration of an electrode terminal of the semiconductor element 300 in a solder melting (reflow) process of the embodiment are shown in FIG. 3(b) through FIG. 3(f).

Figure 4:
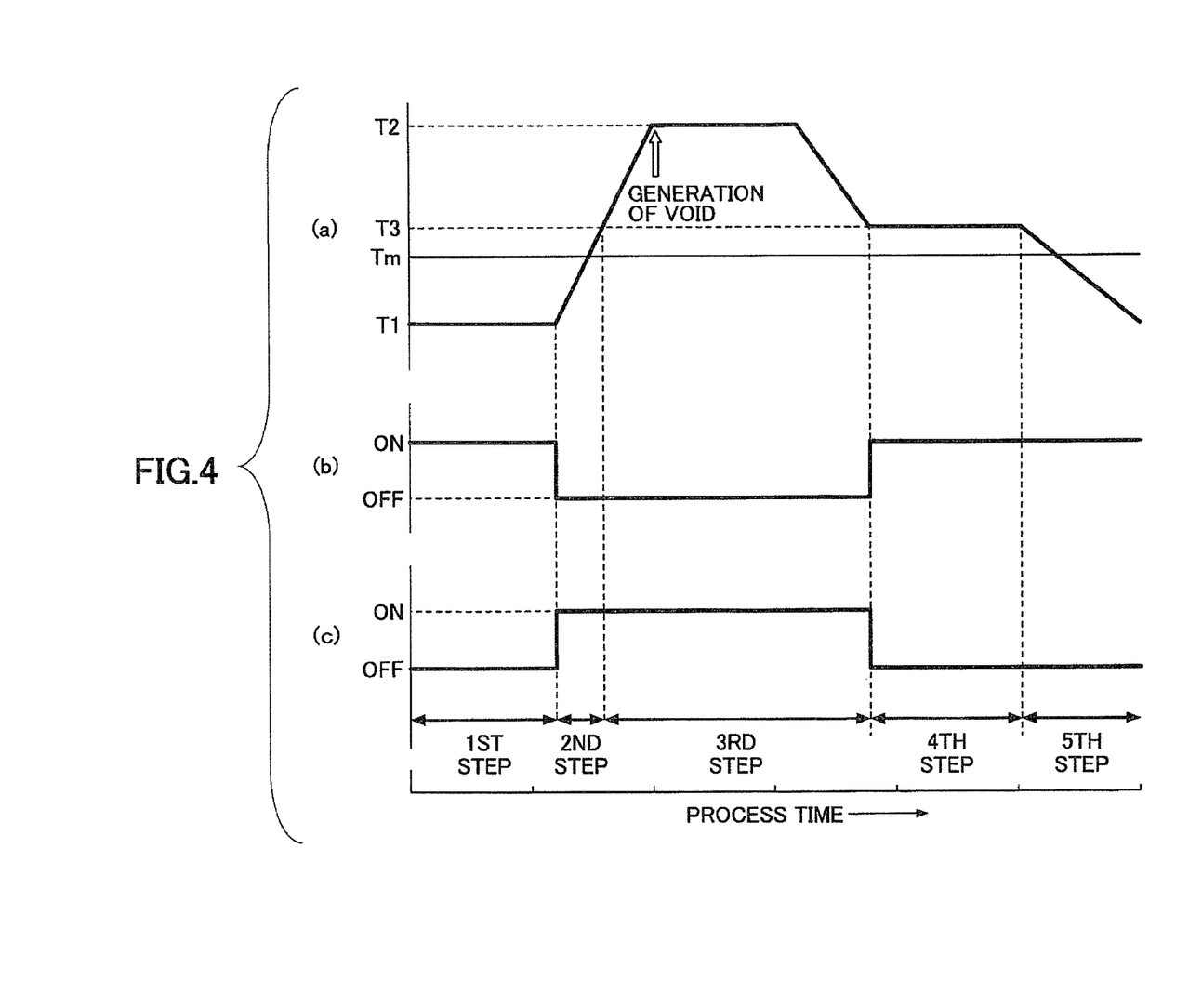
FIG. 4 is a graph showing changes of a processing temperature and introducing of processing gas of the forming method of the electrode of the embodiment.

In addition, changes with time of heating and cooling process temperature and process atmosphere in the reflow process are shown in FIGS. 4(a)-4(c). More specifically, FIG. 4(a) shows a temperature change of the subject semiconductor substrate S in the process chamber 501 of the reflow processing apparatus 500. FIG. 4(b) shows a supplying state (ON or OFF) of the reducing gas into the process chamber 501. FIG. 4(c) shows a supplying state (ON or OFF) of the nitrogen gas ($N_2$) into the process chamber 501.

In the embodiment, the semiconductor substrate S where plural semiconductor elements 300 are formed is provided in the process chamber 501 of the reflow processing apparatus 500 and the following processes are applied.

[First Step]

In the process chamber 501, the subject semiconductor substrate S is provided on the heater 502 so that a surface where an electrode pad of the semiconductor element 300, namely a surface having the mushroom shaped solder layer 107, faces upward. As discussed above, the solder layer 107 is made of lead (Pb)—tin (Sn) group solder having a melting point of 314° C. consisting of 95% lead (Pb) and 5% zinc (Sn).

The subject semiconductor substrate S is, first, exposed in a reducing gas environment such as formic (methanoic) acid (HCOOH) gas so that an oxide film (natural oxide film) formed on the surface of the mushroom shaped solder layer 107 of the semiconductor element 300 is removed (initial reducing step).

The contact with the formic (methanoic) acid (HCOOH) gas atmosphere, namely the initial reducing process, is maintained at temperature T1, for example 300° C. or lower, which is equal to or lower than the melting point (Tm) of the solder layer 107, for approximately 3 minutes.

The formic (methanoic) acid (HCOOH) gas is supplied from the bubbling tank 531 to the process chamber 501 via the gas supply tube 553, the switching part 552, and the gas supply tube 551 by using nitrogen ($N_2$) as a carrier gas. The formic (methanoic) acid (HCOOH) gas is discharged from the gas discharge holes 504A of the gas supply and discharge part 504 onto the subject semiconductor substrate S.

[Second Step]

Next, supplying of the formic (methanoic) acid (HCOOH) gas into the process chamber 501 is stopped so that the reducing atmosphere is switched to the nitrogen ($N_2$) atmosphere. Then, the temperature of the subject semiconductor substrate S is gradually increased to a temperature T2 equal to or higher than the melting point Tm of the solder layer 107, such as 370° C. This temperature increasing process is done at the rate of, for example, 40° C./min.

The formic (methanoic) acid (HCOOH) gas in the process chamber 501 is discharged via the gas discharge hole 505 by operating the discharge pump (not shown).

In addition, the nitrogen ($N_2$) gas is supplied from the nitrogen source to the process chamber 501 via the gas supply tube 554, the switching part 552, and the gas supply tube 551 by operating the switching part 552. Oxidizing gas formed by a very small quantity of oxygen or moisture is added into the nitrogen ($N_2$) gas.

By such a heating process, the solder layer 107 is melted and has the substantially spherical-shaped configuration due to its surface tension so as to become the spherical-shaped solder 207 having the surface where the oxide film 108 is formed. See FIG. 3(b).

When the reducing atmosphere is switched to the nitrogen ($N_2$) atmosphere, some of the formic (methanoic) acid (HCOOH) gas may not be discharged but remain in the process chamber 501. In this case, the surface of the spherical-shaped solder 207 is oxidized by moisture generated by thermal decomposition of the formic (methanoic) acid (HCOOH) gas remaining the process chamber 501 so that the oxide film 108 is formed on the surface of the spherical-shaped solder 207.

When the formic (methanoic) acid (HCOOH) gas is heated at approximately 180° C., the formic (methanoic) acid (HCOOH) gas is thermally decomposed to the moisture and nitrogen ($N_2$) so that reducing no longer takes place. However, in this case, it is required that the volume of the process chamber 501 be sufficiently small. Because of this, for example, the process chamber 501 is sealed, flow-in and flow-out of the formic (methanoic) acid (HCOOH) gas stops, and the inside of the process chamber 501 is heated by the heater 502 at a temperature equal to or higher than 180° C. As a result of this, the formic (methanoic) acid (HCOOH) gas remaining in the process chamber 501 is decomposed so that the moisture and nitrogen ($N_2$) are generated.

If the above requirement is satisfied, as discussed above, it is not necessary to add a very small quantity of oxygen and moisture to the nitrogen ($N_2$) gas.

By providing the gas current plate 506, gas flow above the subject semiconductor substrate S is limited so that efficiency of oxidation due to the moisture formed by decomposition of formic (methanoic) acid (HCOOH) gas can be improved.

[Third Step]

Next, a high temperature (T2, 370° C., equal to or higher than the melting point of the solder layer 107) and the nitrogen ($N_2$) atmosphere where a very small quantity of oxidizing gas is added are maintained for a designated time, for example 5 minutes. By such a high temperature heating process in the nitrogen ($N_2$) atmosphere, the addition agent of the plating liquid taken in at the time of forming the solder layer 107 evaporates in the spherical-shaped solder 207, so that the void 109 is formed. See FIG. 3(c).

After the high temperature heating process is applied for a designated time in the nitrogen ($N_2$) atmosphere, the temperature is gradually decreased by rate of, for example, 30° C./min to a temperature equal to or higher, but in the vicinity of, the melting point of the solder, in the nitrogen ($N_2$) atmosphere.

At this time, the void 109 moves in the spherical-shaped solder 207. The void 109 moves to an upper part of the spherical-shaped solder 207, that is a side far from the electrode pad 102 so as to arrive in the vicinity of the oxide film 108 covering the surface of the spherical-shaped solder 207. See FIG. 3(d).

[Fourth Step]

Next, while a temperature equal to or higher than the melting point of the solder (T3, 330 through 340° C.) is maintained, the atmosphere of the process chamber 501 is switched from the ($N_2$) atmosphere to the reducing gas atmosphere having the formic (methanoic) acid (HCOOH) gas as the main gas. The reducing gas atmosphere is maintained for a designated time, for example, 3 minutes. By the heating process at the temperature T3 equal to or higher than the melting point of solder in the reducing atmosphere, the oxide film 108 remaining on the surface of the spherical-shaped solder 207 is reduced and removed, and the void 109 is discharged from the surface of the spherical-shaped solder 207 opened by removing the oxide film 108. See FIG. 3(e). That is, the void 109 existing in the spherical-shaped solder 207 is discharged.

At this time, since the subject semiconductor substrate S including the spherical-shaped solder 207 is heated so as to have a temperature slightly higher than the melting point of the spherical-shaped solder 207, the void 109 does not jet but is discharged immediately and therefore scattering of the solder does not happen.

Since the temperature of the spherical-shaped solder 207 is equal to or lower than the melting point of the solder, a concave part of the surface of the solder 207 formed by discharge of the void 109 immediately returns to the original spherical shape. Even if the oxidization layer exists at the internal surface of the void 109, since the oxidization layer is reduced and removed by the reducing gas, the void 109 can be immediately removed.

[Fifth Step]

After that, the heating process of the subject semiconductor substrate S stops in the reducing atmosphere, and the subject semiconductor substrate S is gradually cooled at a rate of, for example, 25° C./min. By such a cooling process, the spherical shaped solder 207 having a temperature equal to or lower than the melting point (Tm) is solidified. See FIG. 3(f).

Then, the subject semiconductor substrate S having a temperature where the subject semiconductor substrate S can be taken out is conveyed from the reflow process apparatus 500. While the formic (methanoic) acid (HCOOH) gas is applied as reducing gas in the reflow process step of the spherical-shaped solder (solder bump) 207 of the embodiment, hydrogen ($H_2$) instead of formic (methanoic) acid (HCOOH) can be applied.

In addition, while in the reflow process step of the spherical-shaped solder (solder bump) 207 of the embodiment, the process atmosphere in the process chamber 501 is changed to the reducing atmosphere or the oxidizing atmosphere, and depending on the process state, the pressure of the process chamber 501 is kept at 100 Pa through atmospheric pressure. By keeping the pressure of the process chamber 501 within such a pressure range, the process temperature of each step is maintained.

In the manufacturing method of the embodiment, by switching the heating process temperature for the subject semiconductor substrate S and the process atmosphere, in the semiconductor element formed in the subject semiconductor substrate S, it is possible to immediately implement a process for making the solder have the spherical-shaped configuration and a process for discharging or removing the void generated inside the spherical-shaped solder, without causing scattering of the solder.

In other words, in the second step and the third step of the embodiment, the oxide film 108 is formed on the surface of the solder bump 207 whose shape is made spherical by the heating process in the oxidizing atmosphere, and the existence of the oxide film 108 is maintained. Accordingly, the void 109 generated in the solder bump 207 is prevented from being jetted outside the solder bump 207 by the oxide film 108.

In the fourth step, the oxide film 108 is removed from the surface of the spherical-shaped solder bump 207 by a heating process at a temperature equal to or higher than the melting point of the solder bump in the reducing atmosphere. The void 109 is immediately discharged from the surface of the solder bump 207 opened by removal of the oxide film 108 and minute solder particles do not scatter.

In a step for forming the solder bump 207, since the void 109 is removed, scattering of the solder forming the spherical-shaped solder bump 207 does not happen when the semiconductor element 300 is mounted onto an electronic device.

Accordingly, it is possible to manufacture an electronic device with high reliability without causing a short due to the minute solder particles. The steps including and after the second step can be immediately implemented by removing the natural oxide film existing on the surface of the mushroom shaped solder layer 107 by the initial reducing of the first step.

In a case where so-called lead (Pb) free such as tin (Sn)—silver (Ag) group solder is used as the solder, process temperatures of the first through fourth steps are determined corresponding to the melting point, such as 225° C. through 230° C., of the lead (Pb) free solder.

In the meantime, in the above-discussed embodiment, the subject semiconductor substrate S is received in the process chamber 501 and the heating temperature and the process atmosphere for the subject semiconductor substrate S are switched in order, so that the spherical-shaped solder (solder bump) 207 is formed.

Such a reflow process can be implemented by a continuous reflow process apparatus having a conveying mechanism of the subject semiconductor substrate S.

Figure 6:
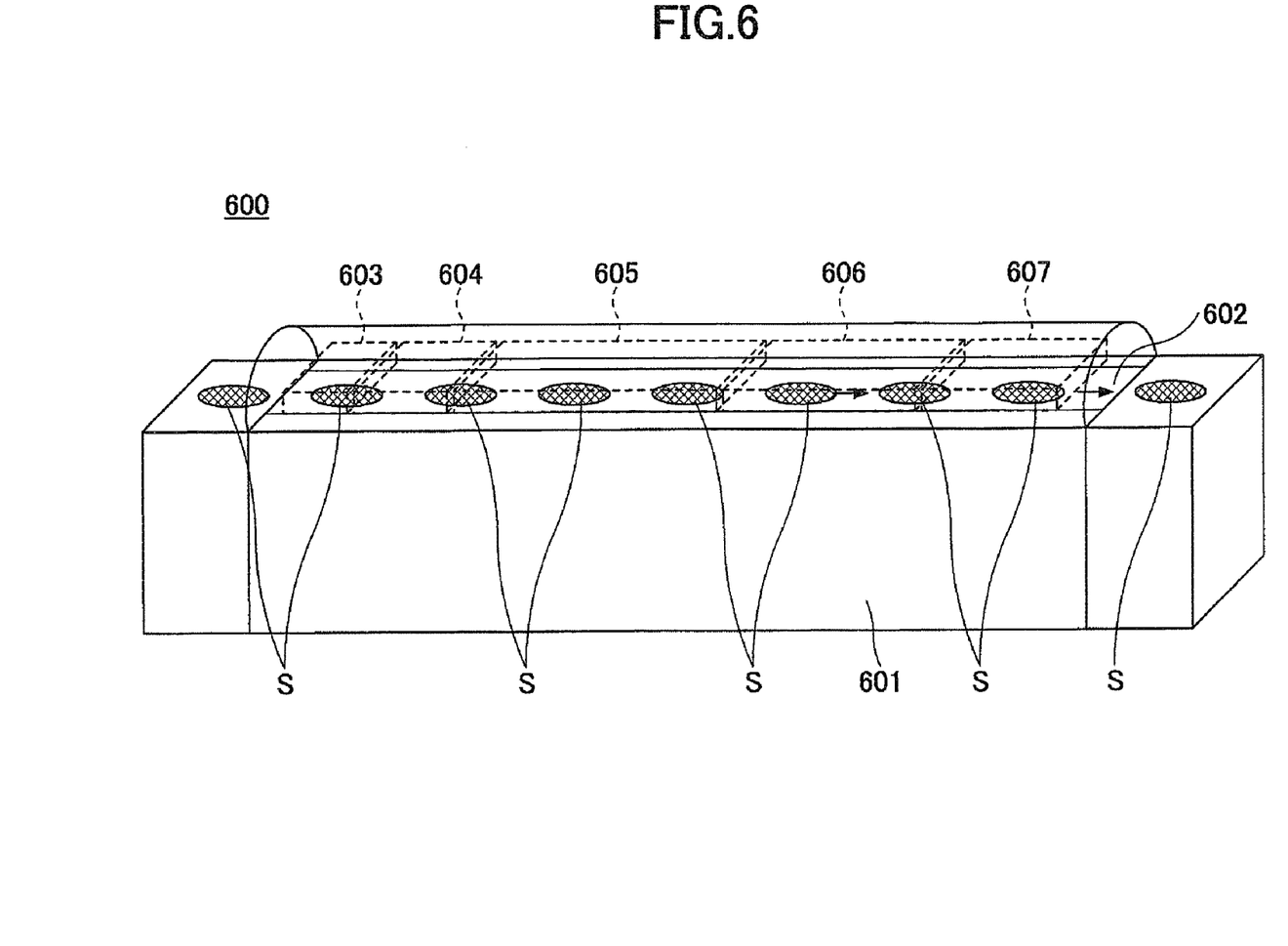
FIG. 6 is a schematic view of a continuous reflow processing apparatus applied to the forming method of the electrode of the embodiment.
Figure 7:
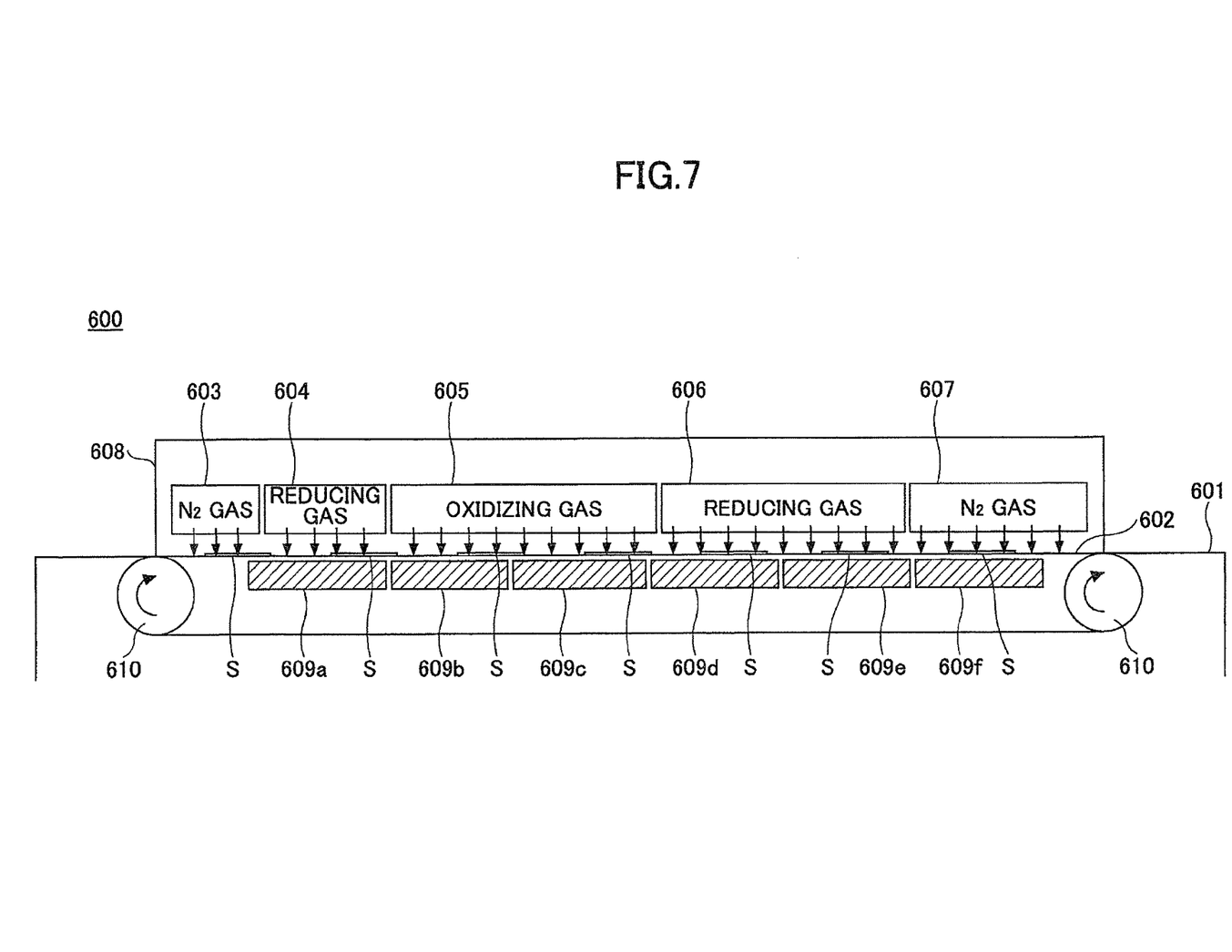
FIG. 7 is a cut-open longitudinal view of the continuous reflow processing apparatus.
Figure 8:
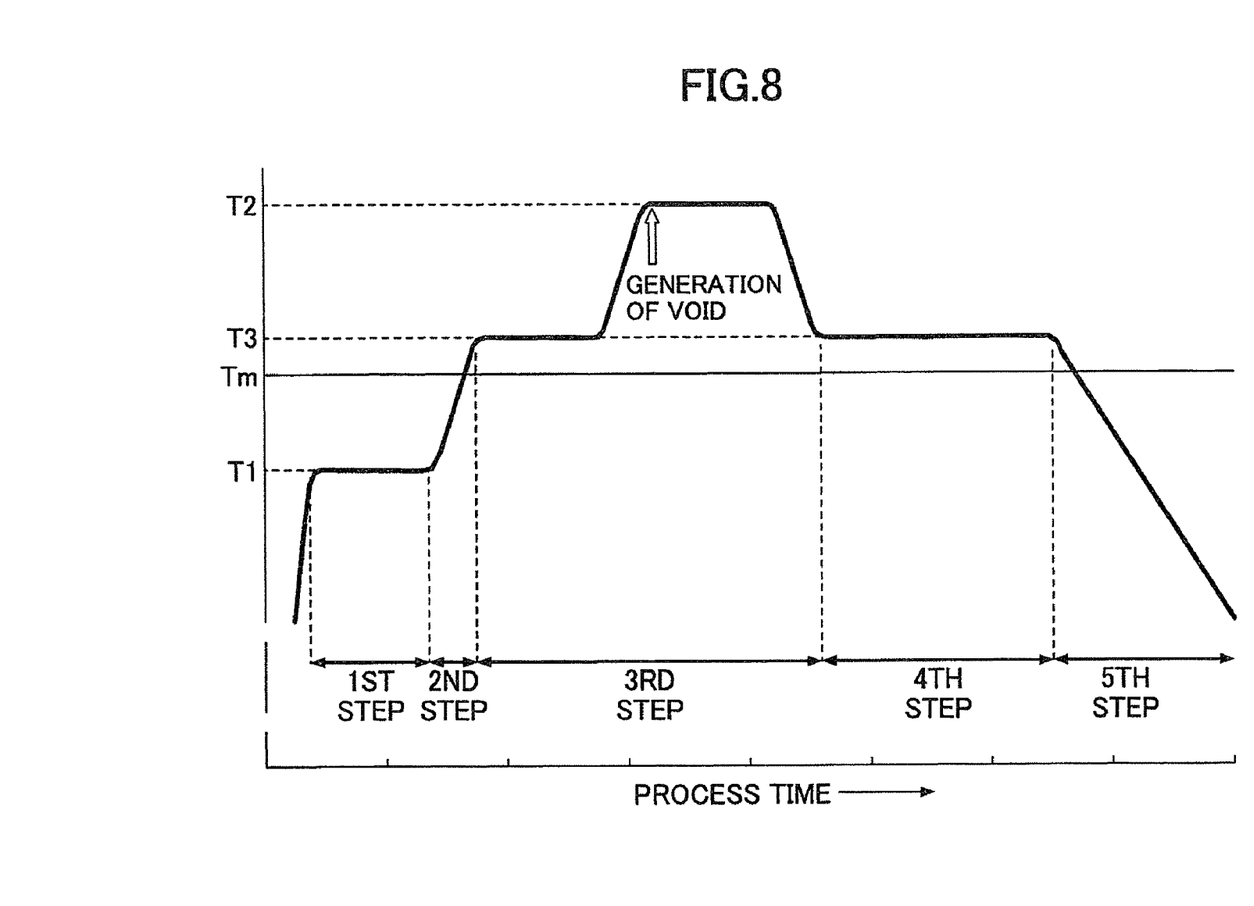
FIG. 8 is a graph showing change of a processing temperature of the forming method of the electrode of the embodiment using the continuous reflow processing apparatus.

The continuous reflow process apparatus has a structure shown in FIG. 6 and FIG. 7. Furthermore, the continuous reflow process apparatus has a temperature distribution shown in FIG. 8 in implementation of the reflow process step.

As shown in FIG. 6 and FIG. 7, the subject semiconductor substrates S are conveyed from the left side to the right side in order by a belt conveyer 602 provided at an upper part of a base 601 of the continuous reflow process apparatus 600. During conveyance of the semiconductor substrate S, various processes are applied.

In the continuous reflow process apparatus 600, above the belt conveyer 602 configured to convey the subject semiconductor substrates S, an external air blocking part 603 and process parts 604 through 607 are provided from the entry side of the subject semiconductor substrates S. First nitrogen ($N_2$) gas is used for the external air blocking part 603. First reducing gas is used for the process part 604. Nitrogen ($N_2$) gas including the oxidizing gas is used for the process part 605. Second reducing gas is used for the process part 606. Second nitrogen ($N_2$) gas is used for the process part 607. These process parts are covered with a cover 608.

Plural heaters 609a through 609f corresponding to the process parts are provided under the belt conveyer 602. The belt conveyer 602 is supported so as to move by rollers 610. An exhaust unit (not shown in FIG. 7) is provided under each of the process parts 604 through 607.

Under this structure, the process parts 604 through 607 form a so-called air curtain by using the nitrogen ($N_2$) gas so that in the steps including and after the step of the process part 604 the external air is blocked.

[First Step]

As the belt conveyer 602 moves, the subject semiconductor substrate S is heated at a temperature T1 (approximately 300° C.) in the process part 604 and exposed in the reducing gas whose main gas is, for example, the formic (methanoic) acid (HCOOH) gas, so that the oxide film formed on the surface of the mushroom shaped solder 107 is removed.

[Second Step]

As the belt conveyer 602 moves, the subject semiconductor substrate S is heated, by the process part 605, at a high temperature T2 which is approximately 370° C. and equal to or higher than the melting point of the solder 107 and exposed to the nitrogen ($N_2$) gas including the oxidizing gas.

The solder layer 107 is melted by the high temperature heating process in the nitrogen ($N_2$) atmosphere including the oxidizing gas so that the spherical shaped solder 207 is formed due to its surface tension. In addition, the oxide film 108 is formed on the surface of the spherical-shaped solder 207. Furthermore, the addition agent of the plating liquid taken into the spherical-shaped solder 207 at the time of forming the solder layer 107 evaporates so that the void is formed.

The subject semiconductor substrate S can be continuously heated at a designated temperature rate in the process parts 604 through 605. For example, like steps shown in FIG. 8, the moving speed and moving time of the belt conveyer 602 can be adjusted by keeping the temperature for a certain period of time slightly higher than the melting point of the solder 207. In this case, for example, a temperature substantially equal to the process temperature T3 in the fourth step discussed below can be applied as the temperature slightly higher than the melting point of the solder 207.

[Third Step]

As the belt conveyer 602 moves, the subject semiconductor substrate S is cooled at the latter part of the process part 605 in the nitrogen ($N_2$) atmosphere so that the temperature is gradually decreased by rate of, for example, 30° C./min to a temperature equal to or higher, but in the vicinity of, the melting point of the solder 207.

At this time, the void moves in the spherical-shaped solder 207. The void moves to an upper part of the spherical-shaped solder 207, that is a side far from the electrode pad 102 so as to reach in the vicinity of the oxide film 108 covering the surface of the spherical-shaped solder 207.

[Fourth Step]

As the belt conveyer 602 moves, the subject semiconductor substrate S is heated, by the process part 606, at a temperature T3 which is approximately 330 through 340° C. and equal to or higher than the melting point of the solder 207, and exposed to the reducing gas again.

By a heating process at a temperature equal to or higher than the melting point of the solder 207 in the reducing atmosphere, the oxide film 108 existing on the surface of the spherical-shaped solder 207 is reduced and removed, and the void 109 is discharged from the surface of the solder 207 opened by removal of the oxide film 108.

[Fifth Step]

After that, the belt conveyer 602 further moves, and the subject semiconductor substrate S is cooled at a temperature equal to or lower than the melting point of the solder 207 by the process part 607 in the nitrogen ($N_2$) atmosphere, so that the spherical-shaped solder 207 is solidified.

That is, the embodiment is not limited to a so-called batch process using the reflow process apparatus shown in FIG. 4. The embodiment can be applied to a continuous process using a belt conveyer.

In this example, when so-called lead (Pb) free such as tin (Sn)—silver (Ag) group solder is used as the solder, process temperatures of the first through fourth steps are determined corresponding to the melting point, such as 225° C. through 230° C., of the lead (Pb) free solder.

Although the method has been described with respect to specific embodiments for a complete and clear disclosure, the appended claims are not to be thus limited but are to be construed as embodying all modifications and alternative constructions that may occur to one skilled in the art that fairly fall within the basic teachings herein set forth.

Although the reflow process for forming the solder bump on the electrode pad provided on the semiconductor substrate as the processed substrate is discussed in the embodiments, the method is not limited to these embodiments. The method can be applied to a process for forming the solder bump on a terminal or a pad of any subject substrate.

For example, the method can be applied to a reflow process for forming the solder bump on an electrode terminal part of a circuit board which is called a wiring board, a supporting board or an interposer. The circuit board is mainly made of insulation resin such as glass epoxy or ceramic. A wiring or electrode is provided on a surface of the circuit board.

The method can be applied to a case where a semiconductor element or an electronic component is fixed on an electrode of a circuit board (which is called a wiring board, a supporting board or an interposer) by using a solder bump or the like.

Instead of nitrogen ($N_2$), for example, helium (He), neon (Ne), argon (Ar), or the like can be used as inactive gas.

This patent application is based on Japanese Priority Patent Application No. 2007-251411 filed on Sep. 27, 2007, the entire contents of which are hereby incorporated herein by reference.

What is claimed is:

1. A manufacturing method of a semiconductor device, comprising the steps of:
   providing an electrode material on a conductive part provided on a semiconductor substrate;
   exposing the electrode material in a first reducing atmosphere before the electrode material is exposed in an oxidizing atmosphere;
   discharging the first reducing atmosphere before the electrode material is exposed in the oxidizing atmosphere;
   exposing the electrode material at a temperature equal to or higher than a melting point of the electrode material in the oxidizing atmosphere; and
   exposing the melted electrode material, in a second reducing atmosphere, at a temperature equal to or higher than the melting point of the electrode material and lower than the temperature at which the electrode material is exposed in the oxidizing atmosphere.

2. The manufacturing method of the semiconductor device as claimed in claim 1,
   wherein the reducing atmosphere includes formic acid gas.

3. The manufacturing method of the semiconductor device as claimed in claim 2,
   wherein the oxidizing atmosphere is generated by thermal decomposition of the formic acid gas.

4. The manufacturing method of the semiconductor device as claimed in claim 3,
   wherein thermal decomposition of the formic acid gas is performed where the formic acid gas is entrapped.

5. The manufacturing method of the semiconductor device as claimed in claim 1,
   wherein the oxidizing atmosphere includes moisture.

6. The manufacturing method of the semiconductor device as claimed in claim 5,
   wherein the oxidizing atmosphere includes inactive gas.

7. The manufacturing method of the semiconductor device as claimed in claim 1,
   wherein the electrode material includes metal having a low melting point.

8. The manufacturing method of the semiconductor device as claimed in claim 1,
   wherein the electrode material includes solder.

* * * * *